(12) United States Patent
Jeon

(10) Patent No.: US 10,049,732 B2
(45) Date of Patent: Aug. 14, 2018

(54) DETERMINING A STATE OF MEMRISTORS IN A CROSSBAR ARRAY

(71) Applicant: Hewlett Packard Enterprise Development LP, Houston, TX (US)

(72) Inventor: Yoocharn Jeon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,052

(22) PCT Filed: Feb. 24, 2015

(86) PCT No.: PCT/US2015/017329
§ 371 (c)(1),
(2) Date: Jan. 28, 2017

(87) PCT Pub. No.: WO2016/137446
PCT Pub. Date: Sep. 1, 2016

(65) Prior Publication Data
US 2017/0271004 A1  Sep. 21, 2017

(51) Int. Cl.
*G11C 13/00* (2006.01)
(52) U.S. Cl.
CPC .................................. *G11C 13/004* (2013.01)
(58) Field of Classification Search
USPC ........................................................ 365/148
See application file for complete search history.

(56) References Cited

U.S. PATENT DOCUMENTS

| 7,995,371 | B2 | 8/2011 | Rinerson et al. |
| 8,036,013 | B2 | 10/2011 | Lowrey et al. |
| 8,427,862 | B2 | 4/2013 | Parkinson |
| 8,570,785 | B2 | 10/2013 | Perner |
| 2006/0056227 | A1 | 3/2006 | Parkinson |
| 2010/0246249 | A1* | 9/2010 | Vanhoucke ........ G11C 13/0004 365/163 |
| 2011/0305063 | A1* | 12/2011 | Perner ................... G11C 5/063 365/148 |
| 2013/0010521 | A1 | 1/2013 | Carter |

(Continued)

FOREIGN PATENT DOCUMENTS

WO  WO-2014107382  7/2014

OTHER PUBLICATIONS

Burr, G.W. et al., Access Devices for 3D Crosspoint Memory, Jul. 24, 2014, American Vacuum Society, J. Vac. Sci. Technology B32(4), Jul./Aug., pp. 040802-1-040802-23.

(Continued)

*Primary Examiner* — Hoai V Ho
*Assistant Examiner* — Minh Dinh
(74) *Attorney, Agent, or Firm* — VanCott

(57) ABSTRACT

In one example in accordance with the present disclosure a method of determining a state of a memristor in a crossbar array is described. In the method a bias voltage is applied to a target row line in the crossbar array, which bias voltage causes a bias current to pass through a target memristor along the target row line. The bias voltage is increased by a predetermined amount to a state voltage. A state current flowing through the target memristor is determined. The state current is based on the state voltage. A state of the target memristor is determined based on the state current.

17 Claims, 7 Drawing Sheets

(56) References Cited

U.S. PATENT DOCUMENTS

| | | | |
|---|---|---|---|
| 2013/0322156 A1* | 12/2013 | Papandreou | G11C 13/0021 365/148 |
| 2014/0003139 A1* | 1/2014 | Pickett | G11C 11/39 365/159 |
| 2014/0153318 A1 | 6/2014 | Perner | |
| 2014/0183439 A1 | 7/2014 | Hashim et al. | |
| 2014/0215121 A1* | 7/2014 | Ordentlich | G06F 12/0246 711/102 |
| 2015/0170025 A1* | 6/2015 | Wu | G06N 3/0445 706/25 |
| 2016/0343433 A1* | 11/2016 | Jeon | G11C 13/004 |
| 2017/0200496 A1* | 7/2017 | Buchanan | G11C 13/004 |

OTHER PUBLICATIONS

International Searching Authority, The International Search Report and the Written Opinion, PCT/US2015/017329, dated Dec. 8, 2015, 12 Pgs.

* cited by examiner

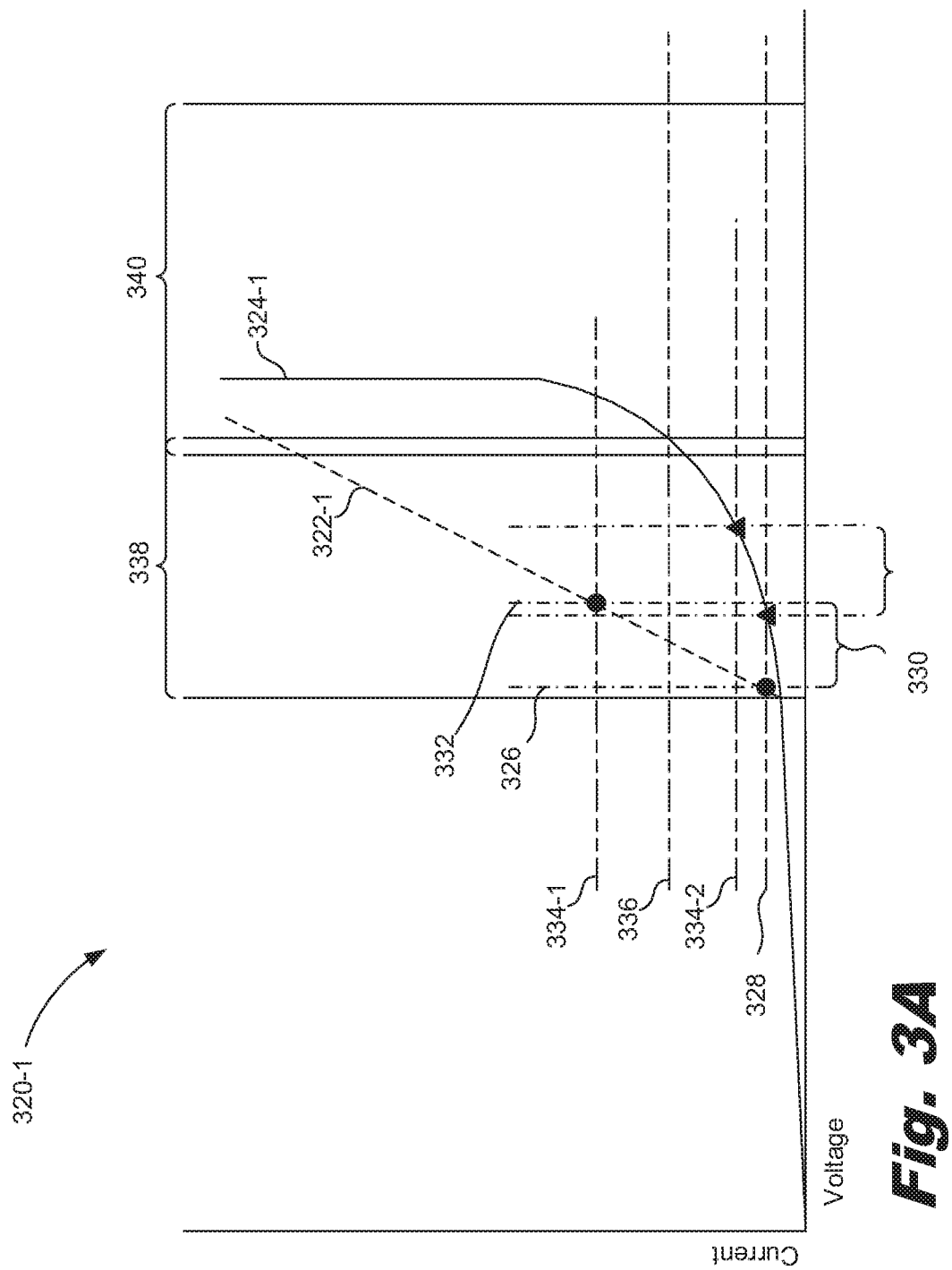

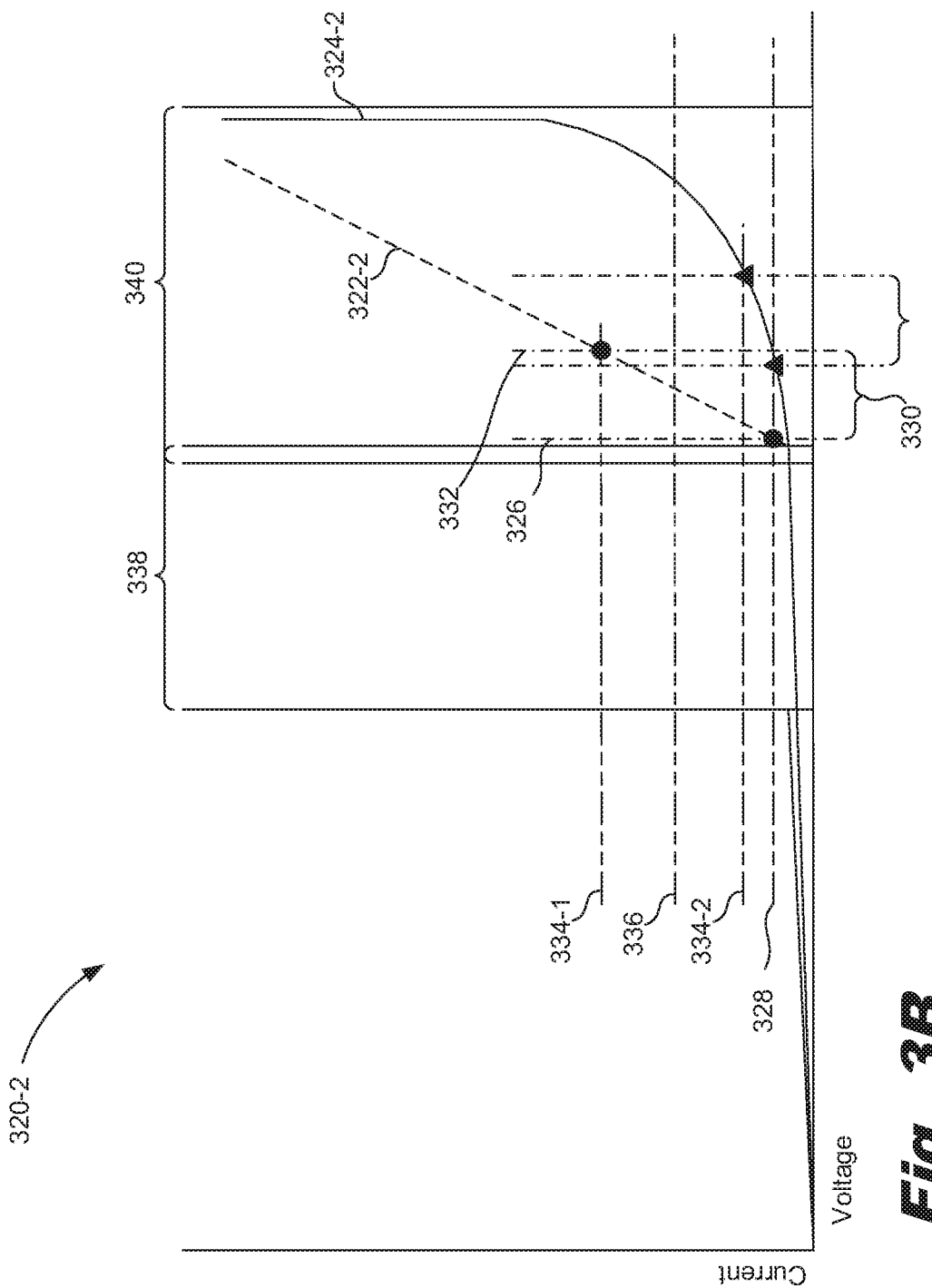

DETERMINING A STATE OF MEMRISTORS IN A CROSSBAR ARRAY

BACKGROUND

Memory arrays are used to store data. A memory array may be made up of a number of memory elements. Data may be stored to memory elements by assigning logic values to the memory elements within the memory arrays. For example, the memory elements may be set to 0, 1, or combinations thereof to store data in a memory array. Much time and effort has been expended in designing and implementing nanoscale memory arrays. In some examples the nanoscale memory arrays may be arranged in a crossbar array where a first number of conducting lines intersect a second number of conducting lines to form a grid where memory elements are placed at each intersection.

BRIEF DESCRIPTION OF THE DRAWINGS

The accompanying drawings illustrate various examples of the principles described herein and are a part of the specification. The illustrated examples are given merely for illustration, and do not limit the scope of the claims.

FIGS. 3A and 3B are examples of current-voltage plots showing the operation of the system for determining a state of a memristor in a crossbar array, according to examples of the principles described herein.

Throughout the drawings, identical reference numbers designate similar, but not necessarily identical, elements.

DETAILED DESCRIPTION

Figure 1:
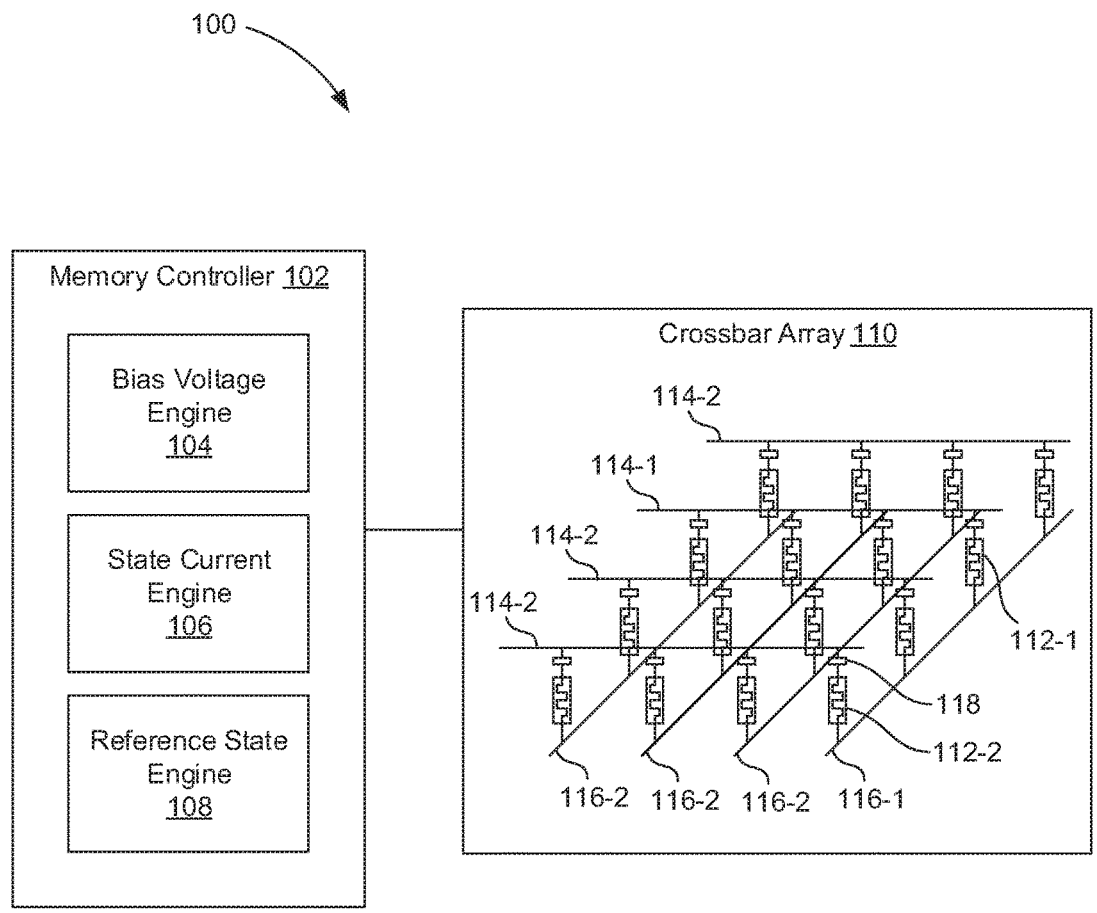
FIG. 1 is a diagram of a system for determining a state of a memristor in a crossbar array, according to one example of the principles described herein.

Crossbar arrays are an example of memory arrays. Crossbar arrays of memory elements, such as memristors, may be used in a variety of applications, including non-volatile solid state memory, programmable logic, signal processing, control systems, pattern recognition, and other applications. A crossbar array includes a first set of conducting lines that intersect a second set of conducting lines, in an approximately orthogonal orientation for example. For simplicity, in the present specification the first set of conducting lines may be referred to as row lines and the second set of conducting lines may be referred to as column lines. A memory cell may be placed at an intersection of a row line and a column line. For example a memory cell may be placed at each intersection, or at every other intersection such as in a chessboard pattern. For simplicity in the present specification, memory cells will be described as being present at each intersection. A memory cell may include a memory element such as a memristor to store information and a selector to regulate current flow through the memory element. In this example, a number of memristors may share a particular row line and another number of memristors may share a particular column line.

Each memory element can represent at least two logic values, for example a 1 and a 0. Memory elements such as memristors may use resistance levels to indicate a particular logic value. In using a memristor as an element in a memory array, a digital operation is emulated by applying an activation energy, such as voltage pulses of different values or polarities, to place the memristor in a "low resistance state" which resistance state is associated with a logical value, such as "1." Similarly, a voltage pulse of a different polarity, or different value, may place the memristor in a "high resistance state," which resistance state is associated with another logical value, such as "0." Each memristor has a switching voltage which refers to a voltage potential across a memristor which effectuates a change in the state of the memristor. For example, a switching voltage of a memristor may be between 1-2 volts (V). In this example, a voltage potential across the memristor that is greater than the switching voltage (i.e., the 1-2V) causes the memristor to change between resistance states. While specific reference is made to a voltage pulse, the activation energy to change the state of the memristor may also be provided by a current source.

To determine what resistance state, and corresponding logic value, is indicated by a memristor, a current is driven through a target memristor by applying a voltage to a row line and a voltage to a column line corresponding to the target memristor. Using the applied voltages and the resistance of the target memristor, a current is collected along a column line and is used to determine the resistance state of the memristor. However, while crossbar memory arrays may offer high density storage, certain characteristics may affect their usefulness in storing information.

For example, in applying a first applied voltage to a target row line and another applied voltage to a target column line, other memristors that fall along these target lines may also see a voltage drop, albeit a voltage drop smaller than the voltage drop across the target memory element. The voltage potential across these partially-selected memory elements generates a current path in the crossbar array. These additional current paths are referred to as sneak currents and are undesirable as they are noise to the intended target output current. Large sneak currents may lead to a number of issues such as saturating the current of driving transistors and increasing power consumption. Moreover, large sneak currents may introduce large amounts of noise which may lead to inaccurate or ineffective memory reading and writing operations.

In some examples, a selector may be placed serially in front of a memristor. The selector may have a threshold voltage. An applied voltage less than the threshold voltage of the selector does not pass through to the corresponding memristor and accordingly a portion of a sneak current may be reduced. In some examples, the threshold voltage of the selector, $V_{th}$, may be set so that a switching voltage of the memory cell, $V_w$, is less than two times as great as the threshold voltage of the selector. In other words $V_w \leq 2V_{th}$. The selector serves to reduce the sneak current through the crossbar array.

For example, during a write operation, the row line corresponding to a target memory element is biased to the switching voltage and the column line corresponding to the target memory element is grounded and the remaining row lines and column lines are biased to a voltage that is a fraction of the switching voltage, for example $V_w/2$. Since the non-target memory elements are biased to half of the switching voltage, which is less than the threshold voltage as described above, in other words $V_w/2<V_{th}<V_w<2V_{th}$, the selector effectively reduces the sneak current by preventing the current from passing through non-target memory cells. However, even while an applied voltage may be less than the threshold voltage of the selector, a small amount of current may still flow through the memory cell.

To determine a resistance state of a memristor, for example during a read operation, a read voltage, $V_r$, is applied across the target memristor, the read voltage being less than the switching voltage so as to not change the state of the memristor, and greater than the threshold voltage of the selector so as to allow a current to be driven through the memristor. However, passing such voltages may not be possible in all circumstances.

For example, due to variations in the geometry and variations in the composition of the components due to fabrication processes, some variation in the threshold voltage of the selector and variation in the switching voltage of the memristor may result. When these variations are large, the ranges of the threshold voltage of the selectors in the array and the switching voltages of the memristors may overlap, leaving no suitable range for the read voltage.

The systems and methods described herein may alleviate these and other complications. More specifically, the present systems and methods describe determining a state of a memristor in a crossbar array by comparing a current change due to a set voltage increase to a reference current. The systems and methods described herein may allow for easy determination of a state of nonlinear memristors. According to the method, while the row lines and non-target column lines are biased to a fractional voltage and a target column line is biased to a sense voltage, a bias voltage is applied to the target row line. The bias voltage being a voltage that drives a predetermined bias current through the target memristor. In some examples, the bias voltage may then be sampled and held. In other examples, the bias voltage is not sampled and held. The bias voltage is increased by a predetermined amount to a state voltage, and a state current, which is based on the state voltage and the resistance state of the target memristor is collected. The state current is compared to a reference current to determine the resistance state of the target memristor.

The present disclosure describes a method for determining a state of a memristor in a crossbar array. In the method, a bias voltage is applied to a target row line in the crossbar array. The bias voltage generates a bias current through a target memristor along the target row line. The bias voltage is increased by a predetermined amount to a state voltage. A state current flowing through the target memristor is determined. The state current is based on the state voltage applied. A state of the target memristor is determined based on the state current.

A system for determining a state of a memristor in a crossbar array is described. The system includes a crossbar array of memristors. The crossbar array includes a number of row lines and a number of column lines intersecting the row lines. A memristor is located at a number of the intersections of a row line and a column line. The system also includes a memory controller. The memory controller includes a bias voltage engine to apply a bias voltage to a target row line of the crossbar array to generate a bias current through a target memristor and to increase the bias voltage by a predetermined voltage amount to a state voltage, a state current engine to determine a state current flowing through a target memristor along the target row line, and a resistance state engine to determine the state of the target memristor based on the state current and a reference current.

A non-transitory machine-readable storage medium encoded with instructions executable by a processor is described. The machine-readable storage medium includes instructions to determine a sneak current through the crossbar array, apply a bias voltage to a target row line in the crossbar array to generate a bias current through a target memristor, increase the bias voltage to a state voltage to generate a state current through the target memristor, and compare the state current less the sneak current to a reference current to determine a state of a target memristor in the target row line.

The systems and methods described herein may allow for effective determination of the resistance state of memristors that are nonlinear. Moreover, the systems and methods described herein, by establishing one baseline value, i.e., one bias voltage, allow for improved read latency as the crossbar array stabilizes with regards to just one baseline value as opposed to multiple baseline values. For example, sometimes a state of a memristor may be determined based on passing two bias voltages through a target memristor and then using the difference between the resultant current to determine the resistance state. Establishing a steady current by varying the bias voltage with a feedback circuit may consume valuable time. Accordingly reducing the number of operations to achieve stabilization may help to reduce the read latency.

As used in the present specification and in the appended claims, the term "memristor" may refer to a passive two-terminal circuit element that changes its electrical resistance under sufficient electrical bias. A memristor may receive an access voltage which may be a read voltage or a write voltage.

Further, as used in the present specification and in the appended claims, the term "target" may refer to a memristor that is to be written to or read from. A target row line and a target column line may be row line and column line that correspond to the target memristor. A target memristor may refer to a memristor with a closed selector as opposed to an open selector.

Still further, as used in the present specification and in the appended claims, the term "partially-selected memristor" may refer to a memristor that falls along a target row line or a target column line and is not a target memristor. The partially-selected memristor may have a voltage drop that is less than a voltage drop of the target memristor.

Still further, as used in the present specification and in the appended claims, the terms "row lines" and "column lines" may refer to distinct conducting lines, such as wires, that are formed in a grid and apply voltages to the memristors in the array. A memristor may be found at the intersection of a row line and a column line. While specific use of the term row and column are used, such are for simplicity and the position of the wires may be in any orientation.

Still further, as used in the present specification and in the appended claims, the term "nonlinear" may refer to a property of the selector or memristor wherein a change in voltage applied across the selector or memristor results in a disproportionate change in current flowing through the selector or memristor, respectively.

Still further, as used in the present specification and in the appended claims, the term "sensing voltage" or "sense voltage" may refer to a voltage that is applied to a target column line of the crossbar array. The sensing voltage may be a voltage used to generate a voltage potential across a target memristor cell. The sensing voltage may cause sufficient current difference between a high resistance and low resistance state of the memristor cell and may avoid causing the resistance state of the memristor to change.

Yet further, as used in the present specification and in the appended claims, the term "a number of" or similar language may include any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described is included in at least that one example, but not necessarily in other examples.

FIG. 1 is a diagram of a system (100) for determining a state of a memristor (112) in a crossbar array (110), according to one example of the principles described herein. The system (100) may be implemented in an electronic device. Examples of electronic devices include servers, desktop computers, laptop computers, personal digital assistants (PDAs), mobile devices, smartphones, gaming systems, and tablets, among other electronic devices. The system (100) may be utilized in any data processing scenario including, stand-alone hardware, mobile applications, through a computing network, or combinations thereof. Further, the system (100) may be used in a computing network, a public cloud network, a private cloud network, a hybrid cloud network, other forms of networks, or combinations thereof.

The system (100) may include a crossbar array (110). The crossbar array (110) may include a number of row lines (114), a number of column lines (116), a number of memristors (112), and a number of selectors (118) such as non-linear selectors that are connected serially with the memristors (112). The combination of a memristor (112) and a selector (118) may be referred to as a memory cell. For simplicity a few instances of each element is identified with a reference number. Even though four row lines (114) and four column lines (116) are depicted in FIG. 1, any number of row lines (114) and column lines (116) may be present in the crossbar array (110). As depicted in FIG. 1, the row lines (114) and the column lines (116) may be orthogonal to one another. The two layers of lines (114, 116) form a crossbar, each of the row lines (114) overlaying the column lines (116) and coming into close contact with each column line (116) at intersections that represent the closest contact between each line.

The lines (114, 116) may effectuate voltage potentials across the memristors (112) by carrying current through the crossbar array (110). For example, a first voltage is applied at a target row line (114-1) and a second voltage is applied at a target column line (116-1). The difference between the first voltage and second voltage generates a voltage potential across the target memristor (112-1). As used in the present specification, memristors (112) that are to be written to or read from may be designated as target memristors (112-1) and may fall along both a target row line (114-1) and a target column line (116-1). Non-target memristors (112-2) are memristors that are not the target memristor (112-1). Similarly, non-target row lines (114-2) and non-target column lines (116-2) may refer to row lines (114) and column lines (116) that do not correspond to the target memristor (112-1).

The voltage potential across the target memristor (112-1) may be either a voltage less than the switching voltage of the target memristor (112-1), i.e., a read voltage; or may be greater than the switching voltage of the target memristor (112-1), i.e., a write voltage. In some examples, the voltage applied at the target row line (114-1) may be the total access voltage value and the target column line (116-1) may be grounded. The remaining non-target row lines (114-2) and non-target column lines (116-2) may receive a fractional voltage that is less than a threshold voltage of the selectors (118) as will be described below.

At the intersection of a number of the number of row lines (114) and a number of the number of column lines (116) is a memristor (112); a memristor (112) being a non-volatile memory element. A memristor (112) can be used to represent a number of bits of data. For example, a memristor (112) in a low state may represent a logic value of "1." The same memristor (112) in a high state may represent a logic value of "0." Each logic value is associated with a state of the memristor (112) such that data can be stored in a memristor (112) by changing the state of the memristor (112). This may be done by applying an access voltage to a target memristor (112-1) by passing voltages to target lines that correspond to the target memristor (112-1).

A memristor (112) is a specific type of memory element that can change resistances. In one example, a memristor (112) works by transporting some of the constituent elements within a switching layer to increase or decrease the resistance of the memristor (112).

A memristor (112) is non-volatile because the memristor (112) maintains its resistivity, and indicated logic value even in the absence of a supplied voltage. In this manner, the memristors (112) are "memory resistors" in that they "remember" the last resistance that they had. Memristance is a property of the electronic component referred to as a memristor (112). If charge flows in one direction through a circuit, the resistance of that component of the circuit will increase. If charge flows in the opposite direction in the circuit, the resistance will decrease. If the flow of charge is stopped by turning off the applied voltage, the component will "remember" the last resistance that it had, and when the flow of charge starts again the resistance of the circuit will be what it was when it was last active. A memristor (112) is a resistor device whose resistance can be changed.

Memristors (112) can be made in a number of geometries and using a variety of materials. One form is a metal-insulator-metal memristor (112). The term metal is meant to refer broadly to indicate a conductor, for instance doped silicon. A memristor (112) may include a bottom electrode (metal), a switching layer (insulator), and a top electrode (metal). The bottom electrode is coated with an insulator to form a switching layer. This switching layer is then coated with a layer of another conductive material to form a top electrode. The switching layer may be an insulator between the bottom electrode and the top electrode. For example, in a first state, the switching layer may be insulating such that current does not readily pass between the bottom electrode to the top electrode. Then, during a switching event, the switching layer may switch to a second state, becoming conductive.

In some examples, the top electrode and bottom electrode of the memristor (112) may be formed from a metallic material such as tantalum or a tantalum-aluminum alloy, or other conducting material such as titanium, titanium nitride, copper, aluminum, platinum, and gold among other metallic materials. The switching layer may be made of a metallic oxide. Specific examples of switching layer materials include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented, the switching layer may be ternary and complex oxides such as silicon oxynitride.

A memristor (112) may be classified as an anion device. In an anionic device, the switching mechanism is the formation of oxygen vacancies in the switching layer that are positively charged and therefore lead to the formation of conducting channels in the switching oxide. By comparison, in a cation memristor (112) the conducting channel is formed from an electrochemically active metal such as copper or silver. In some examples, a memristor (112) may be both an anionic device and a cationic device. For example, an aluminum-copper-silicon alloy oxide based memristor (112) could be an anionic device when the copper concentration is low or a cationic device when the copper concentration is high.

Each memristor (112) may be coupled to a selector (118). A selector (118) is a component that either allows current to flow through the memristor (112) or prevents current from flowing through the memristor (112). For example, the selector (118) may have a threshold voltage, $V_{th}$. When a voltage applied between a row line (114) and a column line (116) is less than the threshold voltage, the selector (118) is open such that no current flows to a corresponding memristor (112). By comparison, when a voltage applied between a row line (114) and a column line (116) is at least as great as the threshold voltage, the selector (118) closes such that current readily flows to a corresponding memristor (112). In this fashion, the selector (118) reduces the sneak current flowing through a crossbar array (110) by preventing current flow through unselected memristors (112-2). Notwithstanding the selector (118), a sub-threshold voltage current may flow through each memristor (112).

Figure 5:
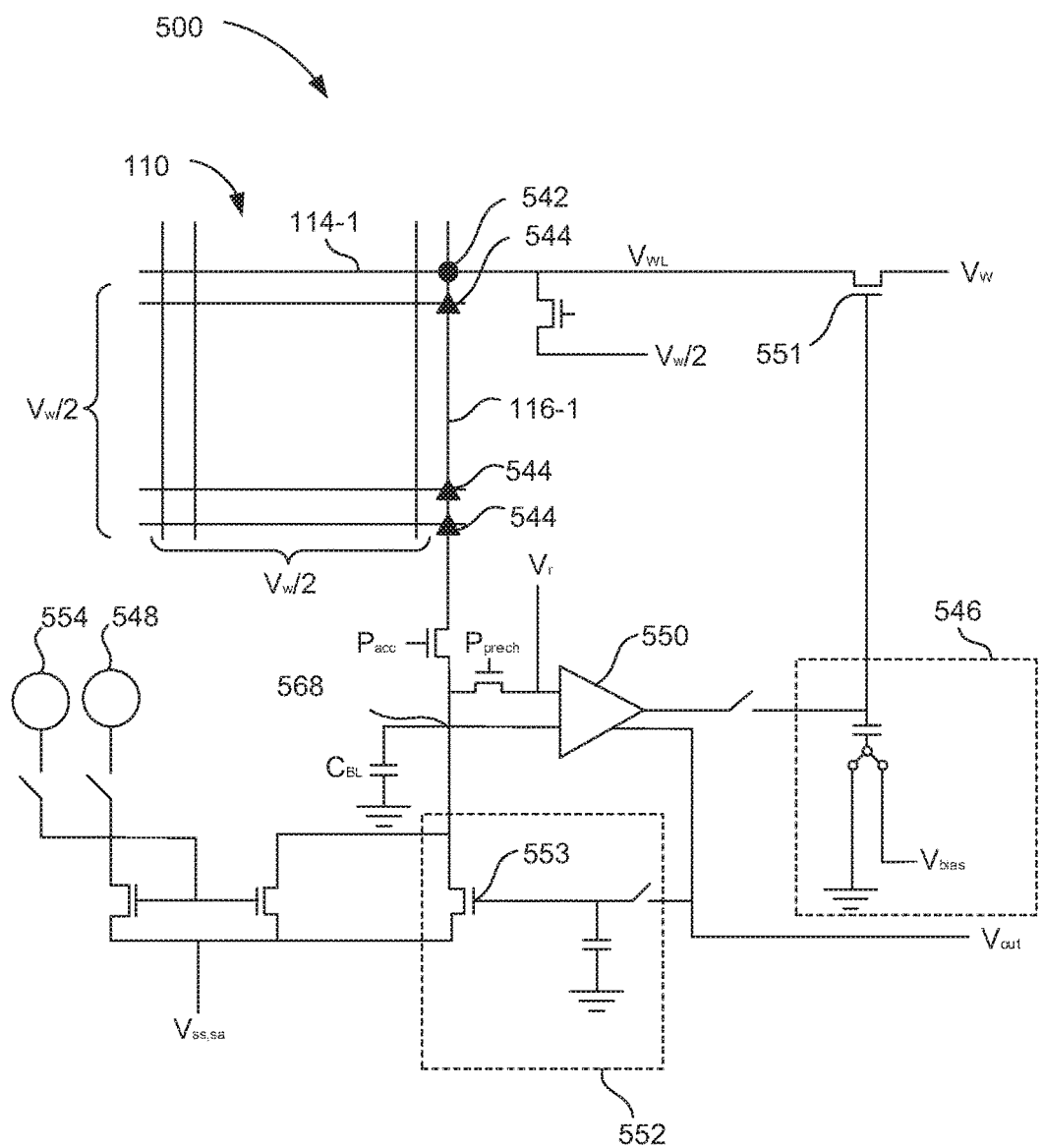
FIG. 5 is a diagram of a circuit for determining a state of a memristor in a crossbar array, according to one example of the principles described herein.

The system (100) may also include a memory controller (102) to determine a state of memristors (112) in a crossbar array (110). The memory controller (102) may be an electrical device or component that, in addition to other functions, operates or controls a memory device. The memory controller (102) may include at least one of circuitry, a processor, or other electrical component. For example, the memory controller (102) may include circuitry such as indicated in FIG. 5.

The memory controller (102) further includes a number of engines used in the implementation of the systems and methods described herein. The engines refer to a combination of hardware such as circuitry and program instructions to perform a designated function. Each of the engines may include a processor and memory. For example, the engines may include circuits and components as part of the example circuit shown in FIG. 5.

The memory controller (102) may include a bias voltage engine (104) to apply a bias voltage across a target memristor (112-1) of the crossbar array (110). The bias current generated by the bias voltage may allow for a baseline to be established from which the state current may be determined. In an example, the bias voltage, a voltage that results in a determined bias current, is applied to the row line (114) that corresponds to a memristor (112) whose state is to be identified. The bias voltage may be greater than the threshold voltage of the selector (118) coupled to the memristor (112) such that the bias voltage is seen by the corresponding memristor (112). In other words, the bias voltage that results in the bias current may be larger than the threshold voltage of the selector (118) such that the voltage is seen by the corresponding target memristor (112-1).

Applying a bias voltage may include increasing the voltage applied to a target row line (114-1) until the output current matches a current output by a bias current source. An example of this comparison is given below in connection with FIG. 5. In some examples, a processor of the memory controller (102) may direct a voltage source to increase the voltage applied to the target row line (114-1) until the output current matches the bias current.

As will be described below, the bias voltage may be determined by collecting the bias current along a target column line (116-1) of the crossbar array (110). For example, the applied voltage along a row line (114) that corresponds to a target memristor (112-1), along with the resistance of the target memristor (112-1), may result in an output current which is collected along the target column line (116-1) that corresponds to the target memristor (112-1). This output current may be used to determine what voltage is used to drive the output current that is equal to a bias current. The voltage at which this occurs may be referred to as the bias voltage, and may vary from device to device.

The memory controller (102) may include a state current engine (106) to determine a state current flowing through the target memory cell and corresponding target memristor (112-1) of the crossbar array (110). For example, after a bias voltage for the target memristor (112-1) has been determined and is applied, the bias voltage may be raised by a predetermined amount to a state voltage. The predetermined amount that the bias voltage is raised may be less than the switching voltage of the memristors (112). Since there may be some variation in the switching voltage of the memristor (112), the predetermined amount should be smaller than a lower tail of the distribution as shown in FIGS. 3A and 3B, i.e., a high resistance state. In some examples, the predetermined value may be set such that it does not reach the high slope range as shown in FIGS. 3A and 3B. Once the state voltage value has been reached, the current resulting from application of the state voltage and the resistance of the target memristor (112-1) is collected as the state current.

The memory controller (102) may also include a reference state engine (108) to determine the resistance state of the target memristor (112-1) based on the state current and a reference current. For example, a reference current may be set between a potential current value for a high resistance memristor (112) and the potential current value for a low resistance memristor (112). The selection of the reference current may be based on pre-identified characteristics of the memristors (112) in the crossbar array (110). If the state current is larger than the reference current, then it may be determined that the target memristor (112-1) is in a low resistance state. By comparison, if the state current is smaller than the reference current, then it may be determined that the target memristor (112-1) is in a high resistance state.

The memory controller (102) may include other elements that relate to the determining of a resistance state of the target memristor (112). For example, the memory controller (102) may include row line (114) and column line (116) selectors that selectively couple the row lines (114) and column lines (116) to voltage sources to apply the various voltages discussed to the row lines (114) and column lines (116).

Figure 2:
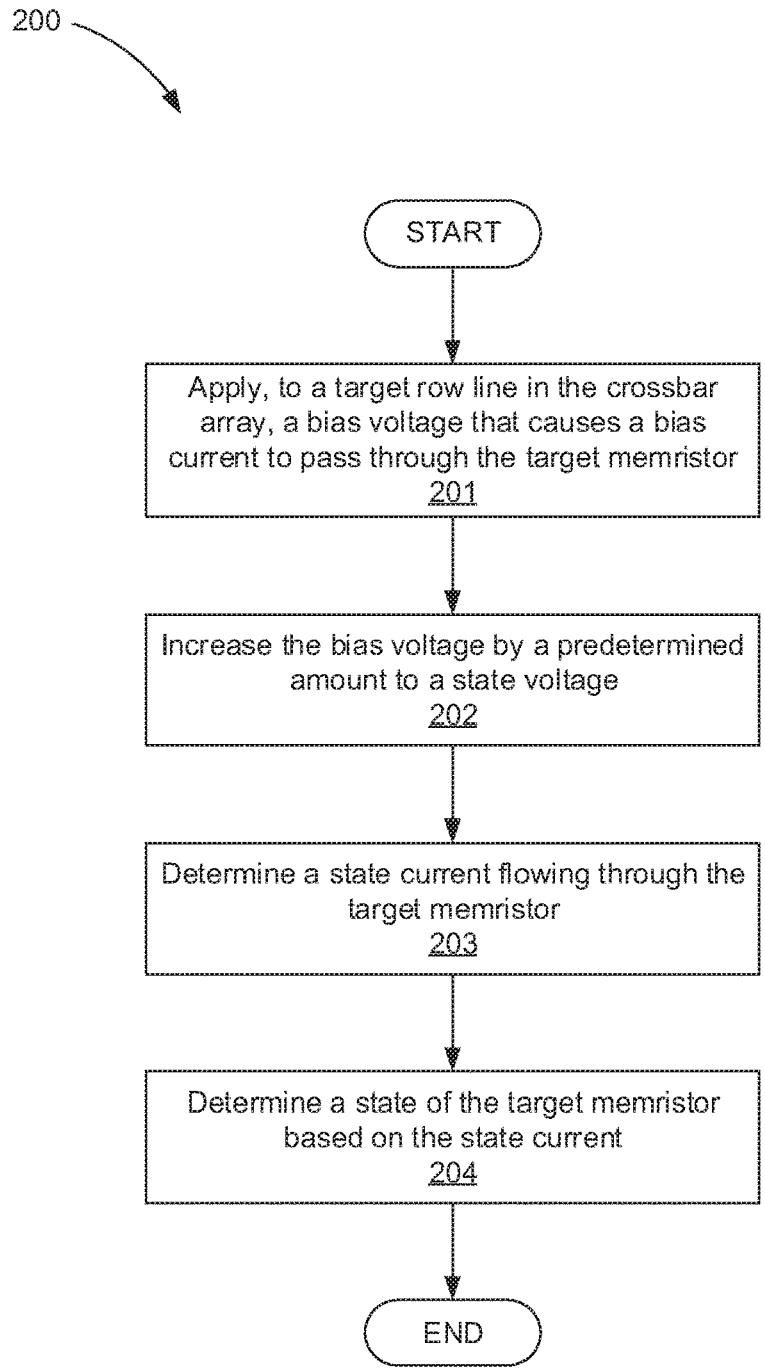
FIG. 2 is a flowchart of a method for determining a state of a memristor in a crossbar array, according to one example of the principles described herein.

FIG. 2 is a flowchart of a method (200) for determining a state of a memristor (FIG. 1, 112) in a crossbar array (FIG. 1, 110), according to one example of the principles described herein. The method (200) includes applying (block 201) a bias voltage to a target row line (FIG. 1, 114-1) in the crossbar array (FIG. 1, 110). A bias voltage may be a voltage that causes an output current to match a predetermined bias current. For example, the output current based on an applied bias voltage may be detected along a target column line (FIG. 1, 116-1) and compared to a predetermined bias current, which predetermined bias current is output by a bias current source. For example, the memory controller (FIG. 1, 102) may include circuitry coupled to the crossbar array (FIG. 1, 110) to output the predetermined bias current. As described above, the bias voltage that is applied (block 201) may be greater than the threshold voltage of the selector (FIG. 1, 118) so that the bias voltage may be seen by the target memristor (FIG. 1, 112-1). Applying (block 201) a bias voltage greater than the threshold voltage may be achieved by making the output current the same as the bias current from the bias current source.

Applying (block 201) the bias voltage may include increasing the voltage applied to a target row line (FIG. 1, 114-1) that corresponds to the target memristor (FIG. 1, 112-1) until the current detected at the output of the target column line (FIG. 1, 116-1) matches the bias current source output. The voltage that generates an output that matches the bias current source output may be indicated as the bias voltage. In one example, the bias voltage may be stored.

In some examples, determining the bias voltage may be performed during a first stage, for example when a bias current source is coupled to a bias voltage application circuit. In another stage the bias current source may be disconnected from the bias voltage application circuit and a reference current source may be coupled to a resistance state determining circuit such that the state current may be compared to the reference current.

The bias voltage value may be increased (block 202) by a predetermined amount to a state voltage. For example, the bias voltage may be increased by a value, $\Delta V$. In other words, the state voltage may equal the bias voltage plus the predetermined $\Delta V$ value. The predetermined amount, $\Delta V$, may be selected such that the $\Delta V$ is smaller than the switching voltage of the memristor (FIG. 1, 112). In other words, the predetermined amount, $\Delta V$, may not be dependent upon the selector (FIG. 1, 118) threshold voltage. However, the selector (FIG. 1, 118) threshold voltage may be accounted for in the state voltage. For example, there may be some variation in the switching voltage of the memristors (FIG. 1, 112) and if a selector (FIG. 1, 118) is combined with a memristor (FIG. 1, 112), the combined switching voltage of the two may have a wider variation than each of the memristor (FIG. 1, 112) switching voltage and the selector (FIG. 1, 118) threshold voltage individually. As the selector (FIG. 1, 118) threshold variation is accounted for by setting the bias voltage to give a fixed bias current, adjusting the $\Delta V$ accounts for the variation of the switching voltage of a memristor (FIG. 1, 112) independent of the switching voltage of the selector (FIG. 1, 118).

The method (200) includes determining (block 203) a state current flowing through the target memristor (FIG. 1, 112-1). As described above, based on an applied voltage and the resistance of a memristor (FIG. 1, 112), a current flowing across the memristor (FIG. 1, 112) may be collected and analyzed. Accordingly, the state current may be based on the value $\Delta V$ and the resistance of the target memristor (FIG. 1, 112-1). This state current may be collected along a target column line (FIG. 1, 116-1) that corresponds to the target memristor (FIG. 1, 112-1) and may be used by the memory controller (FIG. 1, 102) to determine a resistance state of the target memristor (FIG. 1, 112-1).

The method (200) includes determining (block 204) a resistance state of the target memristor (FIG. 1, 112-1) based on the state current. For example, the crossbar array (FIG. 1, 110) may be coupled to circuitry that compares the state current to a reference current. The reference current, $I_{ref}$, may be a value that is between the anticipated current flowing through a memristor (FIG. 1, 112) in a high resistance state, $I_{HRS}$, and the anticipated current flowing through a memristor (FIG. 1, 112) in a low resistance state, $I_{LRS}$. In other words, $I_{HRS} < I_{ref} < I_{LRS}$. With the reference current between the anticipated low and high resistance state current, it can easily be determined whether the state current is the high resistance state current or the low resistance state current.

For example, the voltage potential of a sensing node, that is close to the target column line (FIG. 1, 116-1), may be determined by the relative sizes of current 1) flowing into the sensing node from the crossbar array (FIG. 1, 110) a current 2) flowing out through the circuit connected to the sensing node. For example, the current flowing out of the sensing node may be the reference current (plus the sneak current) and the current flowing in may be the state current (plus the sneak current). If the state current is larger than the reference current (thus indicating a low resistance state), the unbalanced current will drive up the potential of the sensing node by charging a capacitor with the difference between the two currents. By comparison, if the reference current is larger than the state current (thus indicating a high resistance state), the unbalanced current will drive down the potential of the sensing node.

FIGS. 3A and 3B are examples of current-voltage plots (320-1, 320-2) showing the operation of the system (FIG. 1, 100) for determining a state of a memristor (FIG. 1, 112) in a crossbar array (FIG. 1, 110), according to examples of the principles described herein. The plots (320-1, 320-2) show voltage along the x-axis and current along the y-axis. Specifically, the plots (320-1, 320-2) shows I-V characteristics of two different memristors (FIG. 1, 112) with different selector (FIG. 1, 118) threshold voltage variations. FIG. 3A shows the I-V characteristics of a first memristor (FIG. 1, 112) in a low resistance state and a high resistance state are indicated by the lines (322-1) and (324-1), respectively. Similarly, FIG. 3B shows the I-V characteristics of a second memristor (FIG. 1, 112) in a low resistance state and a high resistance state are indicated by the lines (322-2) and (324-2), respectively.

As indicated by the high resistance lines (324-1, 324-2) the memristors (FIG. 1, 112) may be nonlinear and may have nonlinear current-voltage behavior. Nonlinearity may refer to a property of a memristor (FIG. 1, 112) wherein an increase in voltage applied to a memristor (FIG. 1, 112) generates a disproportionate increase in current flowing through the memristor (FIG. 1, 112). This indicates that the differential resistances of a memristor (FIG. 1, 112) as compared between the low resistance state and high resistance state may be similar. Referring to FIGS. 3A and 3B, the differential resistance may be indicated by the slope of the low resistance and high resistance lines (322, 324). As can be seen in FIGS. 3A and 3B, for a certain voltage range the slope between the low resistance lines (322) and the high resistance lines (324) may be similar. Accordingly, determining resistance state based on voltage changes may be inconclusive.

To determine a resistance state of a memristor (FIG. 1, 112), a bias voltage (326) may be applied to a row line (FIG. 1, 114) which results in an output current that matches a bias current (328). As the threshold voltage of the different selectors (FIG. 1, 118) may be different, this may result in different bias voltages being used for different memristors (FIG. 1, 112) depending on the threshold voltage of the selector (FIG. 1, 118). For example, if each memristor (FIG. 1, 112) is biased with the same fixed bias voltage, wide variety may exist in the output current due to the different threshold voltages of the corresponding selectors (FIG. 1, 118). Subsequently, the bias voltage (326) may be increased by a predetermined amount (330) to a state voltage (332). As can be seen in FIGS. 3A and 3B, the predetermined amount (330) may be the same regardless of the bias voltage (326). The state current (334), i.e., the current flowing through a memristor (FIG. 1, 112) based on a predetermined voltage increment (330), may be compared to a reference current (336) to determine the resistance state of the memristor (FIG. 1, 112). By stepping up the bias voltage with a given increment, the resulting current for the cells with varying selector (FIG. 1, 118) threshold voltage may be the same as long as the resistance of the memristors (FIG. 1, 112) is the same. Accordingly, the output current may be compared with a fixed reference current to determine the resistance state of the memristor (FIG. 1, 112).

If the state current (334-1) is larger than the reference current (336), the memristor (FIG. 1, 112) may be determined to be in a low resistance state as indicated by the low resistance line (322-1). In other words, when a memristor (FIG. 1, 112) is in a low resistance state, current is more freely allowed to flow, resulting in a larger current through the memristor (FIG. 1, 112). By comparison, if the state current (334-2) is less than the reference current (336), the memristor (FIG. 1, 112) may be determined to be in a high resistance state as indicated by the high resistance line (324-1). In other words, when a memristor (FIG. 1, 112) is in a high resistance state, current is less free to flow resulting in a smaller current through the memristor (FIG. 1, 112).

As can be seen in FIGS. 3A and 3B, the system (FIG. 1, 100) may allow for the indication of a state, and corresponding logic value of nonlinear memristors (FIG. 1, 112) regardless of any overlap between a threshold voltage range (338) of the selector (FIG. 1, 118) and a switching voltage range (340) of the memristor (FIG. 1, 112).

Figure 4:
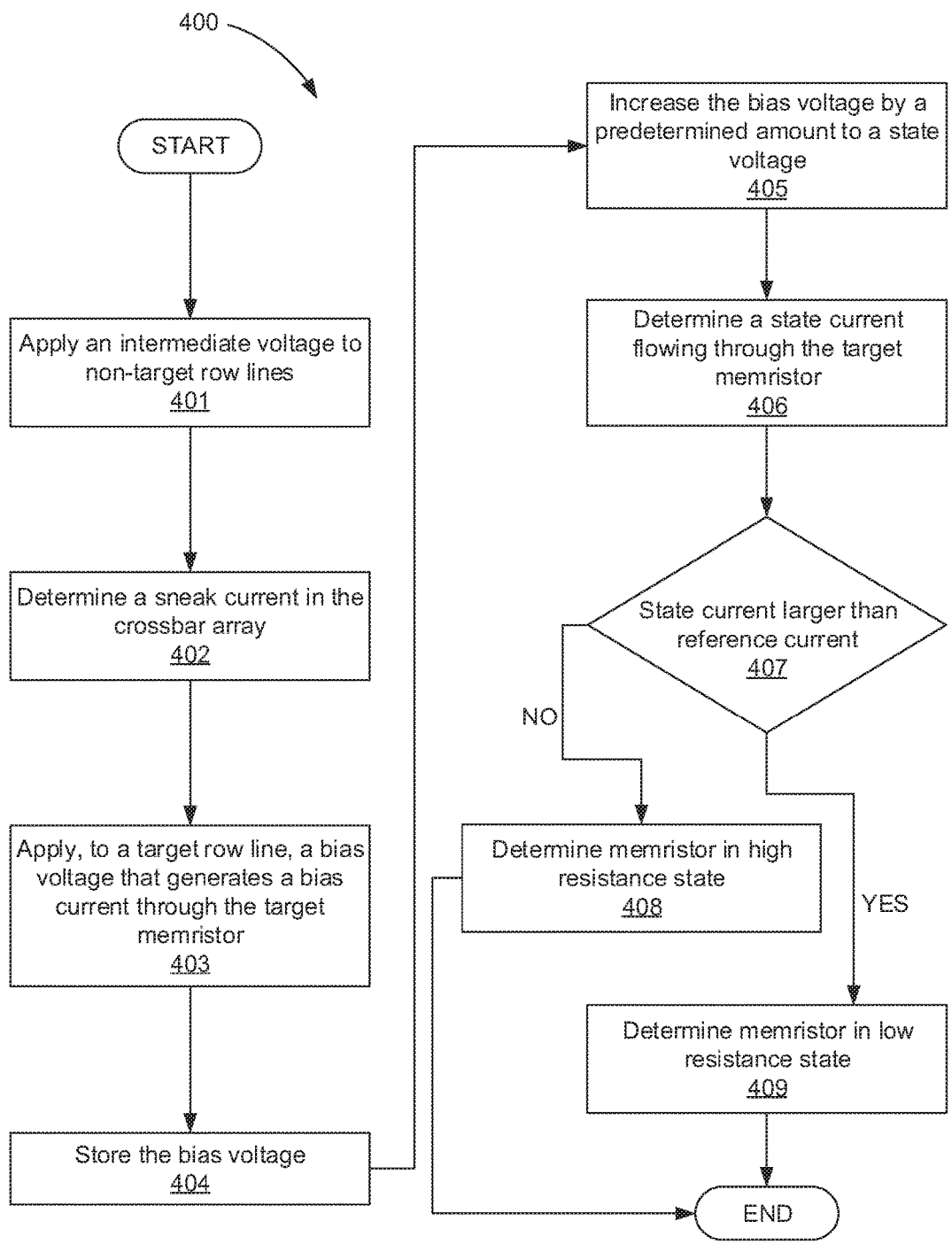
FIG. 4 is a flowchart of a method for determining a state of a memristor in a crossbar array, according to another example of the principles described herein.

FIG. 4 is a flowchart of a method (400) for determining a state of a memristor (FIG. 1, 112) in a crossbar array (FIG. 1, 110), according to another example of the principles described herein. The method (400) may include applying (block 401) an intermediate voltage to non-target row lines (FIG. 1, 114-2). For example, to determine a resistance state of a target memristor (FIG. 1, 112-1), a voltage drop across the target memristor (FIG. 1, 112-1) may be effectuated by applying a read voltage V, to the target row line (FIG. 1, 114-1). The remaining row lines (FIG. 1, 114-2) and the remaining column lines (FIG. 1, 116-2) may be set to an intermediate voltage between the voltage applied to the target row line (FIG. 1, 114-1) and a voltage applied to the target column line (FIG. 1, 116-1). In some examples, the intermediate voltage may be a fractional voltage of V/2 or less (i.e., V/3, V/4) throughout the operation. Applying (block 401) a fractional voltage to non-target row lines (FIG. 1, 114-2) may neutralize currents by leveling the voltage between the target row line (FIG. 1, 114-1) and non-target row lines (FIG. 1, 114-2).

The method (400) may include determining (block 402) a sneak current in the crossbar array (FIG. 1, 110). As described above sneak currents may be undesirable current that leaks through the crossbar array (FIG. 1, 110) that obfuscates the accurate determination of resistance states of the memristors (FIG. 1, 112). As will be described, the sneak current may later be subtracted from the state current to accurately determine the resistance state of the memristor (FIG. 1, 112).

The method (400) includes applying (block 403) to a target row line (FIG. 1, 114-1), a bias voltage that causes a bias current to pass through the target memristor (FIG. 1, 112-1). This may be performed as described in connection with FIG. 2. The bias voltage controlled by an operational amplifier maintains a sense node voltage the same as during the sneak current sampling stage. So the current generated by the bias voltage is added to the output current of the target column line (FIG. 1, 116-1). In other words, the bias current is the output current with the sneak current subtracted. As the sampled and held sneak current is being drawn out from the target column line (FIG. 1, 116-1) throughout the next stage where the target row line (FIG. 1, 114-1) voltage is stepped up, the same amount of current (i.e., the sneak current) is subtracted from the total current while the additional reference current is drawn.

The method (400) may include storing (block 404) the bias voltage. For example, the bias voltage may be stored in a capacitor of a circuit. Storing the bias voltage may allow the bias voltage to be increased by an amount, $\Delta V$, to obtain the state voltage and collect the corresponding state current. Accordingly, the method (400) may include increasing (block 405) the bias voltage by a predetermined amount to a state voltage. This may be performed as described in connection with FIG. 2.

The method (400) includes determining (block 406) a state current flowing through the target memristor (FIG. 1, 112). This may be performed as described in connection with FIG. 2.

The method (400) includes determining (block 407) whether the state current is larger than a reference current. For example, a reference current, supplied by a reference current source, may be compared using circuitry coupled to the crossbar array (FIG. 1, 110). The reference current may be selected so as to fall between an anticipated current from a high resistance state memristor (FIG. 1, 112) and an anticipated current from a low resistance state memristor (FIG. 1, 112). If the state current is larger than the reference current (block 407, determination YES), it may be determined (block 409) that the memristor (FIG. 1, 112) is in a low resistance state. By comparison, if the state current is not larger than the reference current (block 407, determination NO), it may be determined (block 408) that the memristor is in a high resistance state.

FIG. 5 is a diagram of a circuit (500) for determining a state of a memristor (FIG. 1, 112) in a crossbar array (110), according to one example of the principles described herein. As described above, the memory controller (FIG. 1, 102) may include a number of elements such as processors and circuits to carry out the functionality of determining a state of a memristor (FIG. 1, 112) in a crossbar array (110). FIG. 5 depicts an example of some circuitry that may be used. In FIG. 5, a target row line (114-1) is indicated by a reference number and a target column line (116-1) is indicated by a reference number and for simplicity the remaining row lines and column lines are not labeled. The location of a target memristor (FIG. 1, 112-1) may be indicated by the circle (542). As described above, an intermediate voltage ($V_w/2$) may be applied to non-target row lines (FIG. 1, 114-2) and non-target column lines (FIG. 1, 116-2) and a sense voltage ($V_r$) may be applied to a target column line (116-1). Applying the intermediate voltage ($V_w/2$) and sense voltage ($V_r$) may result in partially-selected memristors (FIG. 1, 112) indicated by the triangles (544). Similarly, different voltages such as an intermediate voltage, a bias voltage, and a state voltage (i.e., bias voltage plus ΔV) may be applied to the target row line (114-1).

The circuit (500) may include a bias component (546) that may form part of the bias voltage engine (FIG. 1, 104) to increase the voltage applied to the target row line (114-1) until a current that matches a bias current is reached. For example, an operational amplifier (550) may compare a sense node (568) voltage to a sense voltage ($V_r$) and may output a voltage proportional to the difference. The output is fed to a gate of an N-type field effect transistor (NFET) (551). In this example, if the total current (i.e., the cell current and sneak current) out of the target column line (116-1) is larger than the sum of the current from the bias current source (548) and the sneak current stored in the sample and hold circuit (552), the sense node (568) voltage will rise higher than the sense voltage ($V_r$). Accordingly, the output from the operational amplifier (550) will go down and the voltage at the source of the NFET (551) will also go down to reduce the current through the target cell until the current passing through the target memristor (FIG. 1, 112-1) is approximately equal to the bias current. Once stabilized, the operational amplifier (550) may be disconnected from the capacitor in the bias component (546) such that the voltage stored in the capacitor of the bias component (546) holds the gate voltage of the NFET (551) and in turn the voltage applied to the target row line (114-1).

Similarly, the system (FIG. 1, 100) may include a sneak current engine to determine a sneak current. In some examples, an inverted output of the operational amplifier (550) may be fed to a gate of transistor (553) in a sneak current circuit component (552). Similar to as above, once the voltage stabilizes, the current from the target column line (116-1). i.e., the sneak current, may be the same as current flowing through the transistor (553), which may be controlled by the gate voltage of the transistor (553). If the operational amplifier (550) output is disconnected from the capacitor in the sneak current circuit component (552), the voltage stored in the capacitor may hold the gate voltage and in turn the current through the transistor (553).

After the bias current has been reached, a predetermined voltage, ΔV, is added to the bias voltage to generate a state voltage. In this example, the bias current source (548) may be disconnected and a reference current source (554) may be connected such that the operational amplifier (550) compares a state current resulting from the state voltage to the reference current. If the state current is larger than the reference current, a large output, $V_{out}$, is generated and the memristor (FIG. 1, 112) may be determined to be in a low resistance state. By comparison, if the state current is smaller than the reference current, a smaller output, $V_{out}$, is generated and the memristor (FIG. 1, 112) may be determined to be in a high resistance state.

The circuit (500) may include other components such as a bit line capacitor, "$C_{BL}$;" "$P_{prech}$" which is a control pulse input to precharge the bit line to $V_{sense}$; "$P_{acc}$" is a control pulse input to connect a target column line (116-1) to the sensing circuit.

Figure 6:
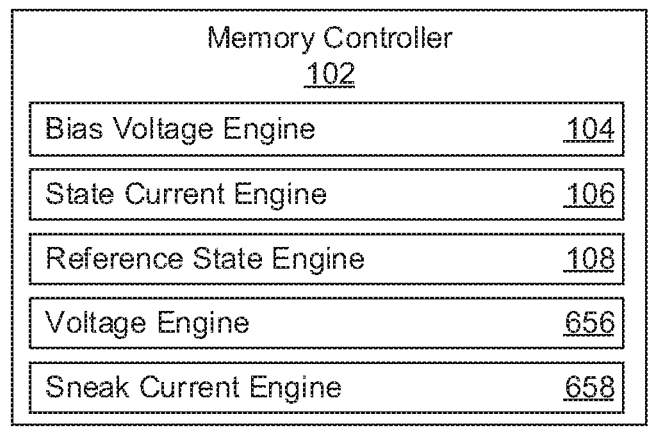
FIG. 6 is a diagram of a memory controller according to the one example of the principles described herein.

FIG. 6 is a diagram of a memory controller (102) according to one example of the principles described herein. The memory controller (102) includes a bias voltage engine (104), state current engine (106), and reference state engine (108) that may be examples of similar components described in connection with FIG. 1. The memory controller (102) may also include a voltage engine (656) and a sneak current engine (658). The engines (104, 106, 108, 656, 658) refer to a combination of hardware and program instructions to perform a designated function. Each of the engines (104, 106, 108, 656, 658) may include circuitry. Program instructions may be stored in memory and cause the processor to execute the designated function of the engine.

The voltage engine (656) applies a number of voltages to a number of row lines (FIG. 1, 114) corresponding to the target memristor (FIG. 1, 112-1) and non-target memristors (FIG. 1, 112-2). For example, the voltage engine (656) may cause a voltage source to apply an initial voltage, a bias voltage, an intermediate voltage, a sense voltage and/or an access voltage to the various row lines (FIG. 1, 114) and column lines (FIG. 1, 116) of the crossbar array (FIG. 1, 110).

The sneak current engine (658), which may include the sneak current circuit component (FIG. 5, 552) may determine a sneak current through the crossbar array (FIG. 1, 110). The sneak current engine (658) may also include circuitry to store and hold the sneak current.

Figure 7:
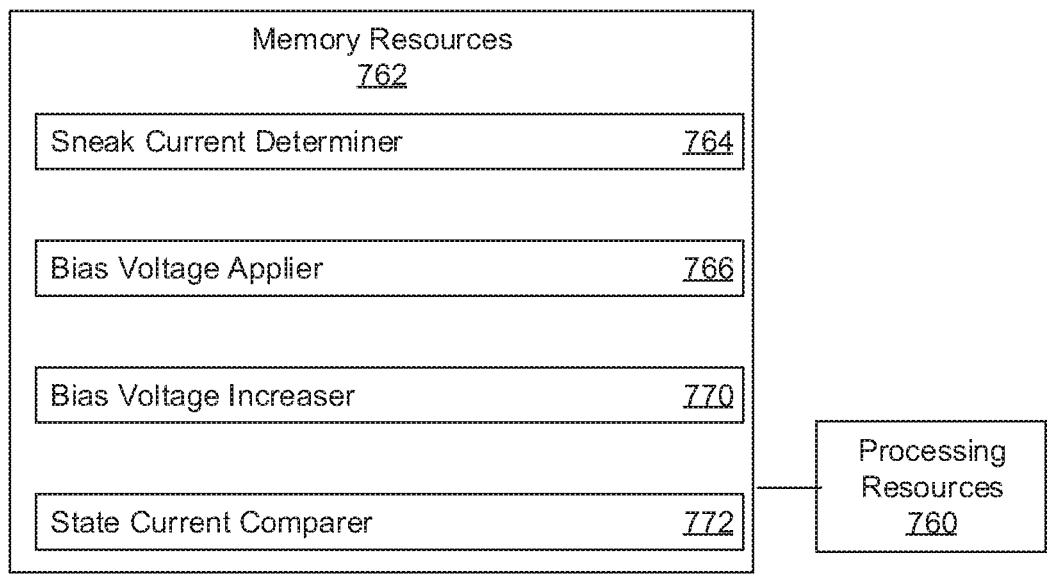
FIG. 7 is a diagram of a memory controller, according to one example of the principles described herein.

FIG. 7 is a diagram of a memory controller (102), according to one example of the principles described herein. In this example, the memory controller (102) includes processing resources (760) that are in communication with memory resources (762). Processing resources (760) include at least one processor and other resources used to process programmed instructions. The memory resources (762) represent generally any memory capable of storing data such as programmed instructions or data structures used by the memory controller (102). The programmed instructions shown stored in the memory resources (762) include a sneak current determiner (764), a bias voltage applier (766), a bias voltage increaser (770), and a state current comparer (772).

The memory resources (762) include a computer readable storage medium that contains computer readable program code to cause tasks to be executed by the processing resources (760). The computer readable storage medium may be tangible and/or non-transitory storage medium. The computer readable storage medium may be any appropriate storage medium that is not a transmission storage medium. A non-exhaustive list of computer readable storage medium types includes non-volatile memory, volatile memory, random access memory, memristor based memory, write only memory, flash memory, electrically erasable program read only memory, magnetic storage media, other types of memory, or combinations thereof.

The sneak current determiner (764) represents programmed instructions that, when executed, cause the processing resources (760) to determine a sneak current through the crossbar array (FIG. 1, 110); for example by signaling to the circuit (FIG. 5, 500) to store the sneak current. The bias voltage applier (766) represents programmed instructions that, when executed, cause the processing resources (760) to apply a bias voltage to a target row line (FIG. 1, 114) in the crossbar array (FIG. 1, 110) for example by signaling a voltage source to apply voltages to a target row line (FIG. 1, 114) of the crossbar array (FIG. 1, 110).

The bias voltage increaser (770) represents programmed instructions that, when executed, cause the processing resources (760) to increase the bias voltage to a state voltage by a predetermined amount; for example by directing a voltage source to increase the voltage applied to a target row line (FIG. 1, 114). The state current comparer (772) represents programmed instructions that, when executed, cause the processing resources (760) to compare a state current less the sneak current to a reference current do determine a resistance state of a target memristor (FIG. 1, 112-1); for example by connecting a reference current source (FIG. 5, 554) to the crossbar array (FIG. 1, 110).

Further, the memory resources (762) may be part of an installation package. In response to installing the installation package, the programmed instructions of the memory resources (762) may be downloaded from the installation package's source, such as a portable medium, a server, a remote network location, another location, or combinations thereof. Portable memory media that are compatible with the principles described herein include DVDs, CDs, flash memory, portable disks, magnetic disks, optical disks, other forms of portable memory, or combinations thereof. In other examples, the program instructions are already installed. Here, the memory resources can include integrated memory such as a hard drive, a solid state hard drive, or the like.

In some examples, the processing resources (760) and the memory resources (762) are located within the same physical component, such as a server, or a network component. The memory resources (762) may be part of the physical component's main memory, caches, registers, non-volatile memory, or elsewhere in the physical component's memory hierarchy. Alternatively, the memory resources (762) may be in communication with the processing resources (760) over a network. Further, the data structures, such as the libraries and may be accessed from a remote location over a network connection while the programmed instructions are located locally. Thus, the memory controller (102) may be implemented on a user device, on a server, on a collection of servers, or combinations thereof.

The memory controller (102) of FIG. 7 may be part of a general purpose computer. However, in alternative examples, the memory controller (102) is part of an application specific integrated circuit.

The processing resources (760) may include the hardware architecture to retrieve executable instructions from the memory resources (762) and execute the executable instructions. The executable instructions may, when executed by the processing resources (760), cause the processing resources (760) to implement at least the functionality of determining a resistance state of a memristor (FIG. 1, 112).

The memory resources (762) may store data such as executable instructions that are executed by the processing resources (760) or other processing device. As will be discussed, the memory resources (762) may specifically store instructions representing a number of applications that the processing resources (760) executes to implement at least the functionality described herein.

The memory resources (762) may include a machine readable medium, a machine readable storage medium, or a non-transitory machine readable medium, among others. For example, the memory resources (762) may be, an electronic, magnetic, optical, electromagnetic, infrared, or semiconductor system, apparatus, or device, or any suitable combination of the foregoing. In the context of this document, a machine readable storage medium may be any tangible medium that can contain, or store machine readable instructions for use by or in connection with an instruction execution system, apparatus, or device. In another example, a machine readable storage medium may be any non-transitory medium that can contain, or store a program for use by or in connection with an instruction execution system, apparatus, or device.

Aspects of the present system and method are described herein with reference to flowchart illustrations and/or block diagrams of methods, apparatus (systems) and instruction sets according to examples of the principles described herein. Each block of the flowchart illustrations and block diagrams, and combinations of blocks in the flowchart illustrations and block diagrams, may be implemented by machine readable instructions. The machine readable instructions may be provided to a processing resources (760) of a general purpose computer, special purpose computer, or other programmable data processing apparatus to produce a machine, such that the machine readable instructions, when executed via, for example, the processing resources (760) or other programmable data processing apparatus, implement the functions or acts specified in the flowchart and/or block diagram block or blocks. In one example, the machine readable instructions may be embodied within a machine readable storage medium; the machine readable storage medium being part of the computer program product. In one example, the machine readable storage medium is a non-transitory machine readable medium.

The preceding description has been presented to illustrate and describe examples of the principles described. This description is not intended to be exhaustive or to limit these principles to any precise form disclosed. Many modifications and variations are possible in light of the above teaching.

What is claimed is:

1. A method for determining a state of a memristor in a crossbar array, the method comprising:
    determining a bias voltage to be applied to a target row line in the crossbar array by increasing a voltage applied to the target row line until an output current matches a bias current output by a bias current source;
    applying, to the target row line in the crossbar array, the bias voltage that causes the bias current to pass through a target memristor in the target row line;
    increasing the bias voltage by a predetermined amount to a state voltage;
    determining a state current flowing through the target memristor, in which the state current is based on the state voltage; and
    determining the state of the target memristor based on the state current.

2. The method of claim 1, further comprising storing the bias voltage.

3. The method of claim 1, in which determining the state of the target memristor based on the state current comprises comparing the state current to a reference current.

4. The method of claim 3, in which comparing the state current to the reference current comprises comparing a sum of the state current and a sneak current to a sum of the reference current plus the sneak current.

5. The method of claim 3, in which a relative value of the state current and the reference current is indicated as a voltage output.

6. The method of claim 1, comprising applying an intermediate voltage to non-target memristors, such that a voltage drop across partially-selected memristors and unselected memristors is smaller than a voltage drop across the target memristor.

7. The method of claim 1, wherein the bias voltage is a single, constant voltage to provide a single baseline to decrease read latency.

8. The method of claim 3, further comprising selecting the reference current based on identified characteristics of a type of memristors in the crossbar array.

9. A system for determining a state of a memristor in a crossbar array, the system comprising:
    a crossbar array of memristors, the crossbar array comprising,
        a number of row lines;
        a number of column lines intersecting the row lines, a memristor located at a number of the intersections of a row line and a column line; and a memory controller, wherein the memory controller comprises:
a bias voltage engine:
to apply a bias voltage to a target row line of the crossbar array to generate a bias current through a target memristor; and
to increase the bias voltage by a predetermined voltage amount to a state voltage;
a state current engine to determine a state current flowing through the target memristor;
a sneak current engine to determine a sneak current through the crossbar array and to subtract the sneak current from at least one of the bias current and the state current and
a resistance state engine to determine the state of the target memristor based on the state current and a reference current.

10. The system of claim 9, in which the memory controller comprises a voltage engine to apply a number of voltages to the number of row lines corresponding to the target memristor and non-target memristors.

11. The system of claim 10, in which the voltage engine applies a sensing voltage to a target column line corresponding to the target memristor.

12. The system of claim 9, in which the crossbar array comprises a number of selectors, each selector coupled in series with a memristor.

13. The system of claim 9, in which the memristors are non-linear memristors that have non-linear current voltage behavior.

14. The system of claim 9, wherein the bias voltage engine comprises an operational amplifier to compare a voltage at a sense node to a sense voltage and output a voltage proportional to a difference between the voltage at the sense node and the sense voltage.

15. The system of claim 14, further comprising:
a bias component comprising a capacitor; and
a switch to selectively connect the operational amplifier to the bias component during stabilization of the operational amplifier.

16. A non-transitory machine-readable storage medium encoded with instructions executable by a processor, the machine-readable storage medium comprising:
instructions to determine a sneak current through a crossbar array;
instructions to apply a bias voltage to a target row line in the crossbar array to generate a predetermined bias current through a target memristor;
instructions to increase the bias voltage to a state voltage by a predetermined amount; and
instructions to compare a state current less the sneak current to a reference current to determine a state of a target memristor in the target row line.

17. The machine-readable storage medium of claim 16, in which the bias voltage is greater than a threshold voltage of a selector coupled in series with the target memristor.

* * * * *